(12) United States Patent
Eaton et al.

(10) Patent No.: US 12,736,574 B2
(45) Date of Patent: Sep. 15, 2026

(54) ELECTRONIC DEVICES WITH ELECTROMAGNETIC INTERFERENCE CORRECTION

(71) Applicant: Apple Inc., Cupertino, CA (US)

(72) Inventors: Michael D Eaton, Menlo Park, CA (US); Dong Zheng, Los Altos, CA (US); Stephen N Sweet, San Jose, CA (US)

(73) Assignee: Apple Inc., Cupertino, CA (US)

( * ) Notice: Subject to any disclaimer, the term of this patent is extended or adjusted under 35 U.S.C. 154(b) by 71 days.

(21) Appl. No.: 18/745,101

(22) Filed: Jun. 17, 2024

(65) Prior Publication Data

US 2025/0102553 A1 Mar. 27, 2025

Related U.S. Application Data

(60) Provisional application No. 63/585,002, filed on Sep. 25, 2023.

(51) Int. Cl.
*G01R 31/00* (2006.01)
*G01R 29/08* (2006.01)

(52) U.S. Cl.
CPC ....... *G01R 31/002* (2013.01); *G01R 29/0814* (2013.01); *G01R 29/0892* (2013.01)

(58) Field of Classification Search
CPC ..... G01R 29/26; G01R 33/54; G01R 13/0272
See application file for complete search history.

(56) References Cited

U.S. PATENT DOCUMENTS 6,424,234 B1 * 7/2002 Stevenson ............ A61N 1/3752 333/182
8,423,135 B2 4/2013 Doerr et al.
(Continued)

FOREIGN PATENT DOCUMENTS

DE 102019216726 A1 5/2021

OTHER PUBLICATIONS

Youqian Zhang, "Detection of Electromagnetic Interference Attacks on Sensor Systems", 2020 IEEE Symposium on Security and Privacy, May 2020, pp. 203-216, IEEE.

*Primary Examiner* — Alvaro E Fortich
*Assistant Examiner* — Temilade S Rhodes-Vivour
(74) *Attorney, Agent, or Firm* — Treyz Law Group, P.C.; David K. Cole

(57) ABSTRACT

An electronic device may have a sensor and may have a radio-frequency signal transmitter. The sensor may be vulnerable to electromagnetic interference (EMI) from the radio-frequency (RF) signals. Therefore, circuitry in the device may determine whether measurements from the sensor have been impacted by EMI. To make this determination, a digital filter may be used. In particular, the digital filter may be a digital persistence filter that generates a signal if the sensor measurement is high for a time that corresponds with the known emission time of the RF signals. Alternatively, the digital filter may receive the sensor measurements in the digital domain and compare the sensor measurements to time-delayed sensor measurements to determine whether the sensor measurements have been impacted by EMI. Control circuitry may discard any of the sensor measurements, or measurements from one or more other sensors, in response to the sensor measurements being impacted by EMI.

18 Claims, 10 Drawing Sheets

(56) References Cited

U.S. PATENT DOCUMENTS

| | | | | |
|---|---|---|---|---|
| 9,339,657 | B2 | 5/2016 | Stancer et al. | |
| 11,047,931 | B2 | 6/2021 | Guo | |
| 11,131,787 | B2 | 9/2021 | Lee et al. | |
| 11,309,928 | B2 | 4/2022 | Li et al. | |
| 11,340,281 | B2 | 5/2022 | Lee et al. | |
| 2006/0077080 | A1* | 4/2006 | Yamauchi | H03M 1/185 341/114 |
| 2010/0168538 | A1* | 7/2010 | Keenan | A61B 5/14532 702/19 |
| 2013/0238264 | A1 | 9/2013 | Kazama et al. | |
| 2016/0294425 | A1 | 10/2016 | Hwang et al. | |
| 2018/0356936 | A1* | 12/2018 | Shepelev | G06F 3/044 |
| 2020/0072646 | A1* | 3/2020 | Baloniak | G01F 1/3287 |
| 2020/0217882 | A1* | 7/2020 | Lee | G01R 29/0814 |

* cited by examiner

ELECTRONIC DEVICES WITH ELECTROMAGNETIC INTERFERENCE CORRECTION

This application claims the benefit of U.S. provisional patent application No. 63/585,002, filed Sep. 25, 2023, which is hereby incorporated by reference herein in its entirety.

FIELD

This relates generally to electronic devices, and, more particularly, to electronic devices with sensors.

BACKGROUND

Electronic devices such as laptop computers, cellular telephones, and other equipment are sometimes provided with sensors. For example, sensors may be incorporated into a device to provide the device with information on current environmental or device conditions.

SUMMARY

An electronic device may have one or more sensors and may have one or more radio-frequency signal transmitters. The sensors may include temperature sensors, accelerometers, gyroscopes, ambient light sensors, humidity sensors, heart rate sensors, and/or blood oxygen sensors, as examples. The sensors may be vulnerable to electromagnetic interference (EMI) from radio-frequency (RF) signals transmitted by the RF signal transmitters. For example, measurements made by the sensors may be inaccurate due to interference from the RF signals.

Therefore, circuitry in the device may determine whether measurements from a sensor have been impacted by EMI. To make this determination, a digital filter may be used. In particular, the digital filter may be a digital persistence filter that generates a signal if the sensor measurement is high for a time that corresponds with the known emission time of the RF signals. The digital persistence filter may operate over a single frame of the sensor measurements (e.g., if the sensor measurement frames are longer than potential EMI) or may operate over multiple frames of the sensor measurements (e.g., if the sensor measurement frames are shorter than the potential EMI).

Alternatively, the digital filter may receive the sensor measurements in the digital domain and may compare the sensor measurements to time-delayed sensor measurements to determine whether the sensor measurements have been impacted by EMI.

Control circuitry may discard any of the sensor measurements, or measurements from one or more other sensors, in response to the sensor measurements being impacted by EMI.

DETAILED DESCRIPTION

An electronic device may include one or more sensors, such as ambient light sensors, pressure sensors, accelerometers, gyroscopes, temperature sensors, humidity sensors, heart rate sensors, blood oxygen sensors, or other sensors. The electronic device may also include transmitters that transmit radio frequencies. These frequencies may act as electromagnetic interference (EMI) with respect to the sensors, rendering the sensors unable to make accurate measurements. Therefore, sensor measurements taken while radio frequencies are transmitted may be discarded.

To determine which sensor measurements have been subject to EMI, a digital filter may be incorporated into the sensor or control circuitry that processes the measurements generated by the sensor. The digital filter may determine whether the sensor measurements have been subject to EMI by relying on the contrast of sensor measurements without EMI and with EMI. In particular, sensor measurements may change slowly when measuring a physical quantity, such as temperature, acceleration, angle of the device, light level, humidity, heart rate, blood oxygen level, or other quantity. In contrast, the sensor measurements may have rapid ride and fall times in the face of EMI.

The digital filter may prevent false alarms that would otherwise be triggered when the sensor is in the presence of EMI. For example, the device may have a set-point temperature (or other physical quantity), and action may be taken when the device is above or below the set-point temperature. The digital filter may prevent false alarm triggers due to EMI that would otherwise register as being above or below the set-point temperature. The digital filter may operate continuously or periodically (e.g., with a set frequency).

Figure 1:
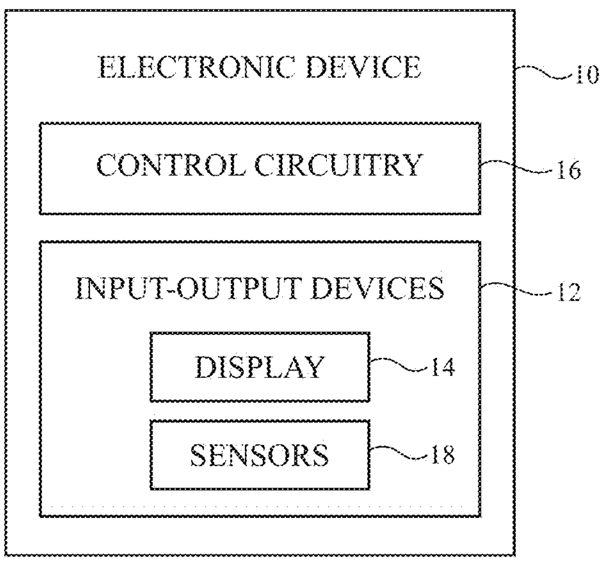
FIG. 1 is a schematic diagram of an illustrative electronic device having display and sensor components in accordance with some embodiments.

An illustrative electronic device of the type that may be provided with one or more sensors is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wristwatch or other device worn on a user's wrist, a pendant device, a headphone or earpiece device, a head-mounted device (or a device embedded in eyeglasses or other equipment worn on a user's head), or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid-state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc. Control circuitry 16 may include communications circuitry for supporting wired and/or wireless communications between device 10 and external equipment. For example, control circuitry 16 may include wireless communications circuitry such as cellular telephone communications circuitry and wireless local area network communications circuitry. Some of the wireless communications circuitry in control circuitry 16 may emit radio-frequency (RF) signals. For example, a transceiver in the wireless communications circuitry may emit the RF signals. The RF signals emitted by the strongest portions of the wireless communications circuitry may generally fall in frequency ranges from approximately 500 MHz to 8 GHz, as an example. As a specific example, long-term evolution (LTE®) EMI may take the form of 1 ms RF pulses at a 100 Hz frame rate.

Input-output devices in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements. Display 14 may include any desired display technology, and may be an organic light-emitting diode (OLED) display, a liquid crystal display (LCD), a microLED display, or any other desired type of display.

Input-output devices 12 may also include sensors 18. Sensors 18 may include a capacitive sensor, a light-based proximity sensor, a magnetic sensor, an accelerometer, a gyroscope, a force sensor, a touch sensor, a temperature sensor, a pressure sensor, a compass, a microphone, a radio-frequency sensor, a three-dimensional image sensor, a camera, a light-based position sensor (e.g., a lidar sensor), a heart rate sensor, a blood oxygen sensor, and/or other sensors. Sensors 18 may also include one or more light detectors that are configured to detect ambient light. Sensors 18 may, for example, include one or more monochrome ambient light sensors and one or more color ambient light sensors that are configured to measure ambient light from the environment in which device 10 is operated. A monochrome ambient light sensor may be used to measure ambient light intensity. A color ambient light sensor may be used to measure the color (e.g., color spectrum, color temperature, color coordinates, etc.) of ambient light and may be used to measure ambient light intensity.

During operation, control circuitry 16 may gather measurements with one or more of sensors 18 and may then process the data gathered from the analog sensor to produce accurate measurements even in scenarios in which sensor data has been gathered in the presence of electromagnetic interference. For example, device 10 may include communications circuitry, including wireless transceiver circuitry (such as the communications circuitry in control circuitry 16), which may emit radio-frequency signals (e.g., a radio-frequency transmitter).

These radio-frequency signals may cause EMI that interferes with at least some of sensors 18 (such as analog sensors of sensors 18) and/or other components within device 10. To determine whether EMI has interfered with one of sensors 18, a digital filter may be used. In particular, because sensors have different responses to EMI and physical changes, the digital filter may determine whether a sensor measurement has been subject to EMI based on the length and magnitude of the sensor response. If the sensor measurement has been taken in the presence of EMI, the sensor measurement may be discarded, or other corrective action may be taken.

Figure 2:
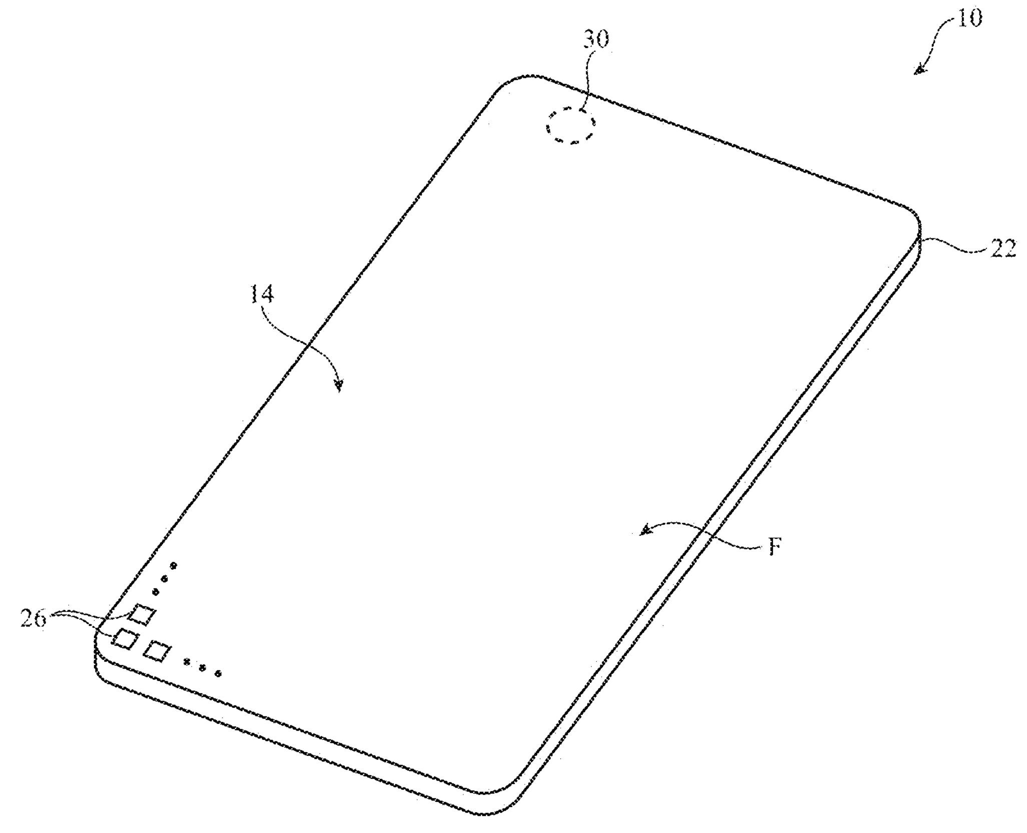
FIG. 2 is a perspective view of an electronic device with a sensor in accordance with some embodiments.

A perspective view of an illustrative electronic device of the type that may include a sensor is shown in FIG. 2. In the example of FIG. 2, device 10 includes a display such as display 14 mounted in housing 22. Display 14 may be a liquid crystal display, an electrophoretic display, an organic light-emitting diode display, or other display with an array of light-emitting diodes (e.g., a display that includes pixels having diodes formed from crystalline semiconductor dies), may be a plasma display, may be an electrowetting display, may be a display based on microelectromechanical systems (MEMs) pixels, or may be any other suitable display. Display 14 may have an array of pixels 26 that extends across some or all of front face F of device 10 and/or other external device surfaces. The pixel array may be rectangular or may have other suitable shapes. Display 14 may be protected using a display cover layer (e.g., a transparent front housing layer) such as a layer of transparent glass, clear plastic, sapphire, or other clear layer. The display cover layer may overlap the array of pixels 26.

Housing 22, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 22 and display 14 may separate an interior region of device 10 from an exterior region surrounding device 10. Housing 22 may be formed using a unibody configuration in which some or all of housing 22 is machined or molded as a single structure or may be formed using multiple structures (e.g., an internal frame structure, one or more structures that form exterior housing surfaces, etc.). If desired, a wristband, headband, or other strap may be coupled to a main portion of housing 22 (e.g., in configurations in which device 10 is a wristwatch or a head-mounted device).

Pixels 26 may cover substantially all of the front face of device 10 or display 14 may have inactive areas (e.g., notches, recessed areas, rectangular areas, or other regions) that are free of pixels 26. The inactive areas may be used to accommodate an opening for a speaker and windows for optical components such as one or more image sensors, sensors such as ambient light sensors, optical proximity sensors, three-dimensional image sensors such as structured light three-dimensional image sensors, and/or a camera flash, etc. In an illustrative configuration, pixels 26 may extend over the entirety of the front surface F of device 10 and may overlap a sensor, such as an ambient light sensor, in region 30. In this type of arrangement, ambient light may pass to the ambient light sensor in region 30 through the array of pixels 26 in display 14.

However, region 30, which may overlap a sensor in device 10, may be formed anywhere on device 10. For example, the sensor may be on a rear surface (opposite front surface F), one of the sidewalls between the rear surface and front surface F, on front surface F but not overlapped by display 14, or at any other location in device 10. Moreover, region 30 may overlap any desired type of sensor, such as an ambient light sensor, a pressure sensor, an accelerometer, a gyroscope, a humidity sensor, a temperature sensor, a heart rate sensor, a blood oxygen sensor, or other suitable sensor. In some embodiments, region 30 may be an opening in housing 22, or region 30 may be a portion of housing 22 that covers the sensor.

Regardless of the position and type of sensor in an electronic device, the sensor may be subject to EMI from communications circuitry (e.g., communications circuitry in control circuitry 16 of FIG. 1). It may be desirable to determine whether the sensor has produced a measurement in the presence of EMI. To make this determination, the different characteristics of EMI and sensor measurements without EMI may be used. Diagrams showing illustrative EMI and illustrative sensor measurements without EMI are shown in FIGS. 3A and 3B, respectively.

Figure 3A:
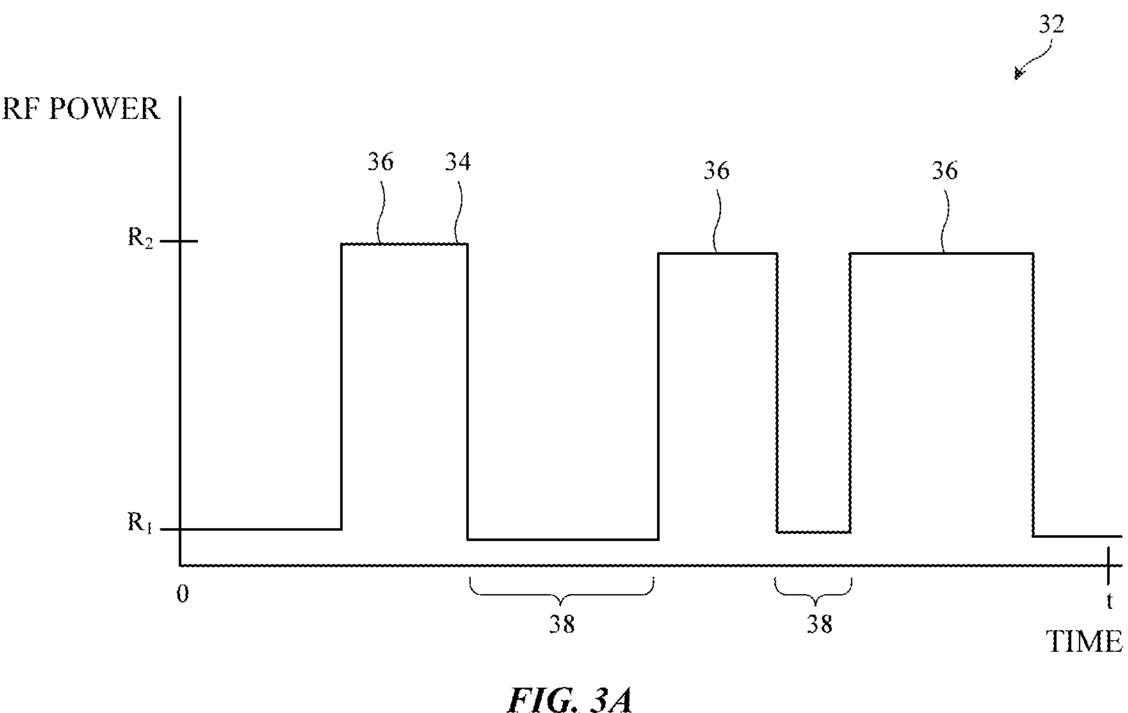
FIG. 3A is a diagram of illustrative radio-frequency signal pulses in accordance with some embodiments.
Figure 3B:
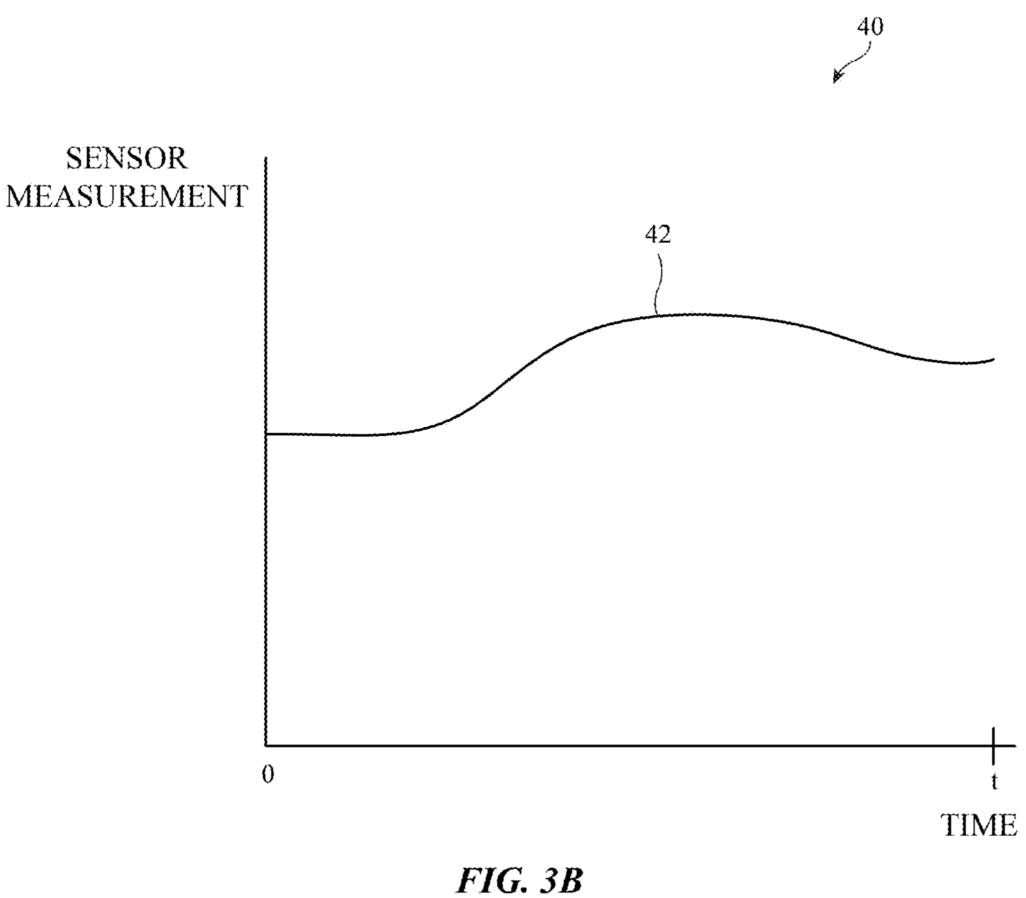
FIG. 3B is a diagram of illustrative sensor measurements over time in the absence of electromagnetic interference (EMI) in accordance with some embodiments.

As shown in FIG. 3A, graph 32 may include illustrative relationship 34 between RF power over time between time 0 and time t. Time t may be approximately 10 milliseconds, less than 50 milliseconds, between 5 and 25 milliseconds, or other suitable time period.

As indicated by relationship 34, the RF power may spike from a minimum value $R_1$, which may be zero, to a maximum value $R_2$ in pulses 36 (e.g., as the communications circuitry is transmitting signals). The magnitude and timing between pulses 36 may vary depending on the type of communications circuitry. For example, LTE® circuitry may emit 1 ms RF pulses 36 at a 100 Hz frame rate. In contrast, Wi-Fi® circuitry may have pulses 36 with durations that vary between approximately 250 microseconds to a few milliseconds. Regardless of the type of wireless communications circuitry, however, there may be RF pulses 36 and gaps 38 between the pulses. RF pulses 36 may form EMI for sensors in an electronic device, so it may be desirable to discard measurements or take other suitable action when a sensor produces measurements during pulses 36.

To differentiate between sensor measurements that are subject to EMI from RF pulses 36 and sensor measurements that are free from EMI, the sensor measurements during these times may be compared. An illustrative sensor measurement that is free from EMI is shown in FIG. 3B.

As shown in FIG. 3B, graph 40 may include illustrative relationship 42 between a sensor measurement that is free from EMI over time between time 0 and time t. The sensor measurement shown in graph 40 may be a temperature measurement, an acceleration measurement, a gyro-angle measurement, a light level/intensity measurement, a humidity measurement, a heart rate measurement, a blood oxygen measurement, or other measurement. As shown by illustrative relationship 42, the sensor measurement may vary relatively slowly over time between time 0 and time t as compared to the fast changes in RF power between time 0 and time t shown in FIG. 3A. Therefore, when not subject to EMI, sensor measurements may exhibit gradual changes (FIG. 3B), while when subject to EMI, the sensor measurements may exhibit fast, high magnitude changes (FIG. 3A).

This difference in sensor behavior depending on the presence of EMI may be used to determine whether given sensor measurements have been taken in the presence of EMI. In particular, a digital filter may be used to determine whether sensor measurements have been taken in the presence of EMI. An illustrative example of a circuit with a digital filter to make such a determination is shown in FIG. 4.

Figure 4:
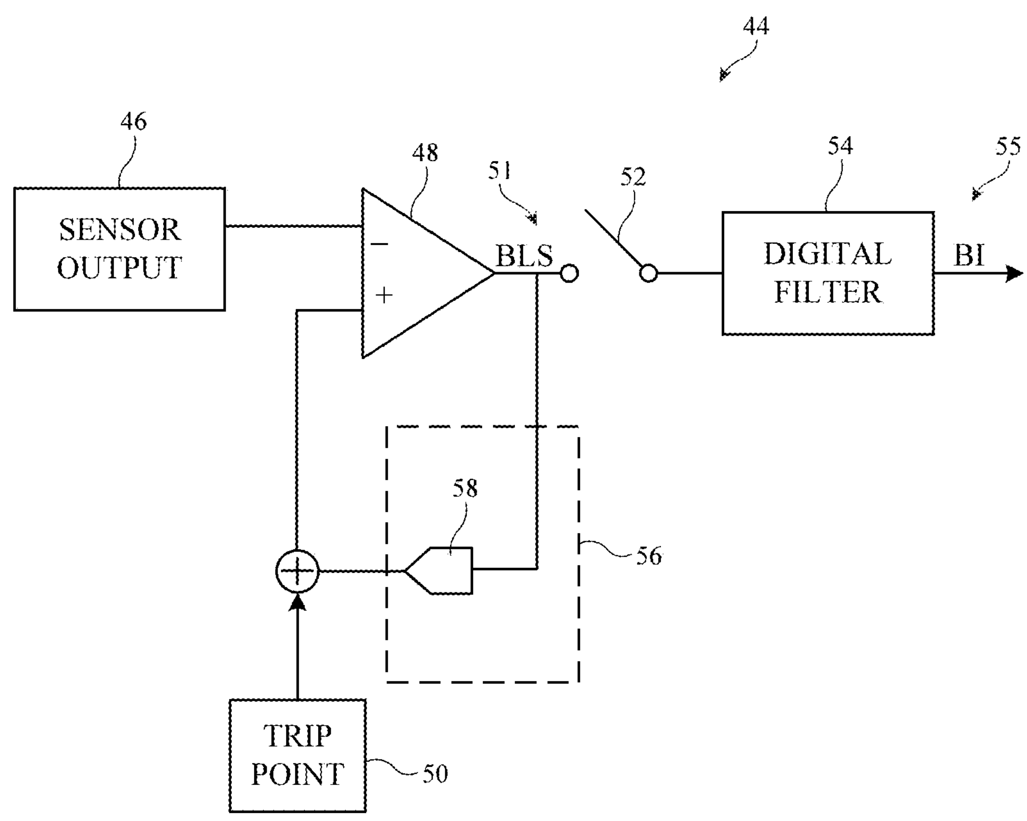
FIG. 4 is a diagram of an illustrative circuit that includes a sensor, a comparator, and a digital filter to determine whether measurements from the sensor have been impacted by EMI in accordance with some embodiments.

As shown in FIG. 4, circuit 44 may take sensor output 46 as an input into comparator 48, along with trip point 50. Trip point 50 may be a point at which a sensor measurement is considered out of range, such as being too high or too low (e.g., a point at which corrective action may be taken by circuitry in the electronic device). The output of comparator 48 may be binary logic signal (BLS) 51, which may be coupled to digital filter 54 through switch 52. The output of digital filter may be binary indicator (BI) 55.

Optional hysteresis circuit 56 may be included between the output of comparator 48 and the input of comparator 48. In particular, optional hysteresis circuit 56 may include a one-bit digital-to-analog converter (DAC) 58. DAC 58 may convert BLS 51 into a one-bit analog value, which may be used to modify the input of comparator 48 (e.g., to modify the threshold of trip point 50) to account for noise.

In operation, comparator 48 may determine whether sensor output 46 is above trip point 50 (as modified by the noise buffer provided by optional hysteresis circuit 56 if circuit 56 is included). If sensor output 46 is above trip point 50, then BLS 51 may be high (e.g., 1). On the other hand, if sensor output 46 is below trip point 50, then BLS 51 may be low (e.g., 0). However, this arrangement is merely illustrative. If desired, BLS 51 may be high if sensor output 46 is below a threshold and low if sensor output 46 is above a threshold.

Switch 52 may be operated at a sample frequency $F_S$. When switch 52 is closed, BLS 51 may be passed to digital filter 54. Digital filter 54 may process BLS 51 to produce binary indicator (BI) 55 of whether sensor output 46 is higher than trip point 50 during a given frame (defined by frequency $F_S$). If BI 55 is high, then sensor output 46 may have risen above (or fallen below) trip point 50, and corrective action may be taken. For example, if a temperature sensor inside of an electronic device has determined that the device has dropped below a temperature trip point, then corrective action may be taken, such as turning the device off, alerting a user, etc.

However, the presence of EMI may falsely trigger a need for corrective action. In other words, if EMI is present while a sensor (such as temperature sensor) is producing output, then the output of the sensor may be inaccurately high or low, which may cause a false alarm if the reading in the presence of the EMI falls above/below the trip point. Therefore, digital filter 54 may additionally detect whether the sensor output 46 has been produced in the presence of EMI. An illustrative example of a digital filter that may be used to determine whether EMI has interfered with the sensor measurement is shown in FIG. 5.

Figure 5:
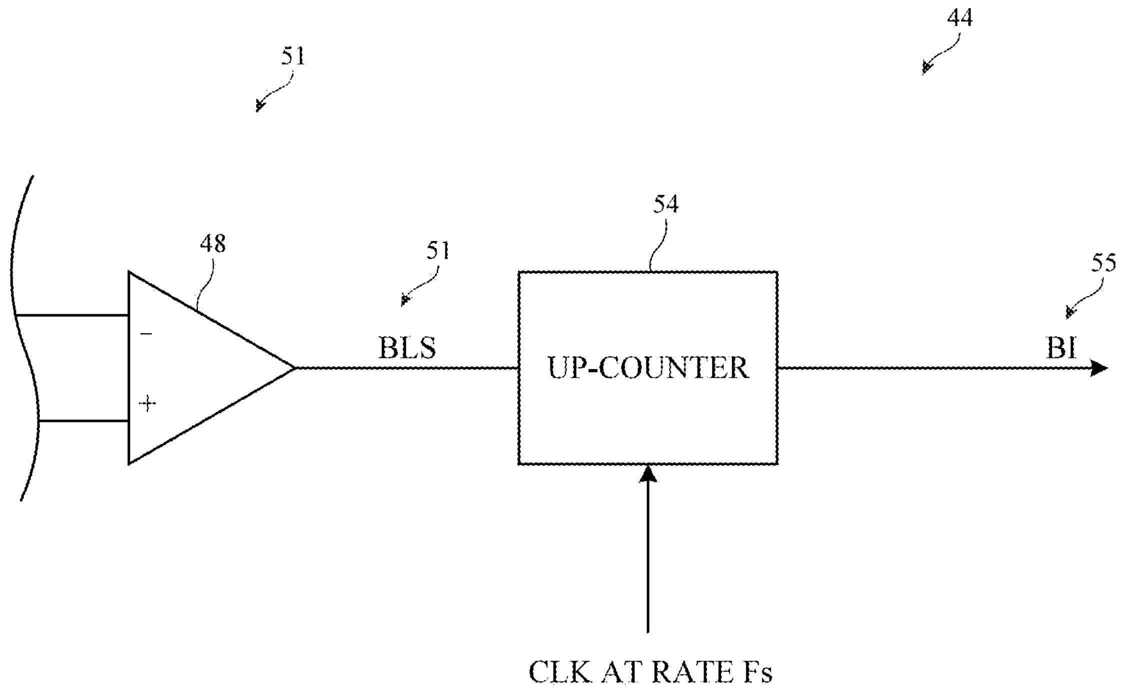
FIG. 5 is a diagram of an illustrative digital persistence filter in accordance with some embodiments.

As shown in FIG. 5, circuit 44 may include digital filter 54 as an up-counter. In particular, digital filter 54 may receive BLS 51 from comparator 48 (e.g., as also shown in FIG. 4). The up-counter of digital filter 54 may be clocked at frame rate $F_S$, which may be greater than 10 kHz, at least 15 kHz, between 10 kHz and 20 kHz, or other suitable frame rate. In general, frame rate $F_S$ may be selected to detect both LTE® and Wi-Fi® EMI (e.g., the frame rate may be longer than the RF pulses of LTE® and Wi-Fi® communications circuitry), and/or any other EMI emitted by communications circuitry in the electronic device.

When BLS 51 is in a low state (e.g., when the sensor measurement does not fall below/above a trip point), the up-counter of digital filter 54 may be reset to a value of −N, where N is any suitable value, such as at least 50, between 75 and 100, 80, or other value. In general, N may be selected based on the value of $F_S$ to ensure that the longest duration of an EMI pulse does not erroneously trigger binary indicator 55.

When BLS 51 is in a high state (e.g., when the sensor measurement falls below/above the trip point), the up-counter of digital filter 54 may increase by one at each clock pulse CLK.

If BLS 51 remains in the high state for longer than time $N/F_S$, the up-counter of digital filter 54 will overflow. In other words, binary indicator 55 may be output from digital filter 54 as an indication that the sensor measurement has been subject to EMI. In response to binary indicator 55, circuitry in the electronic device, such as control circuitry 16 of FIG. 1, may take suitable action, such as discarding or disregarding the sensor measurement that has been subject to EMI. In this way, a digital filter may be used to determine whether a sensor measurement has been subject to EMI. A flowchart of illustrative steps that may be used to detect EMI using a circuit such as the one in FIG. 5 is shown in FIG. 6.

Figure 6:
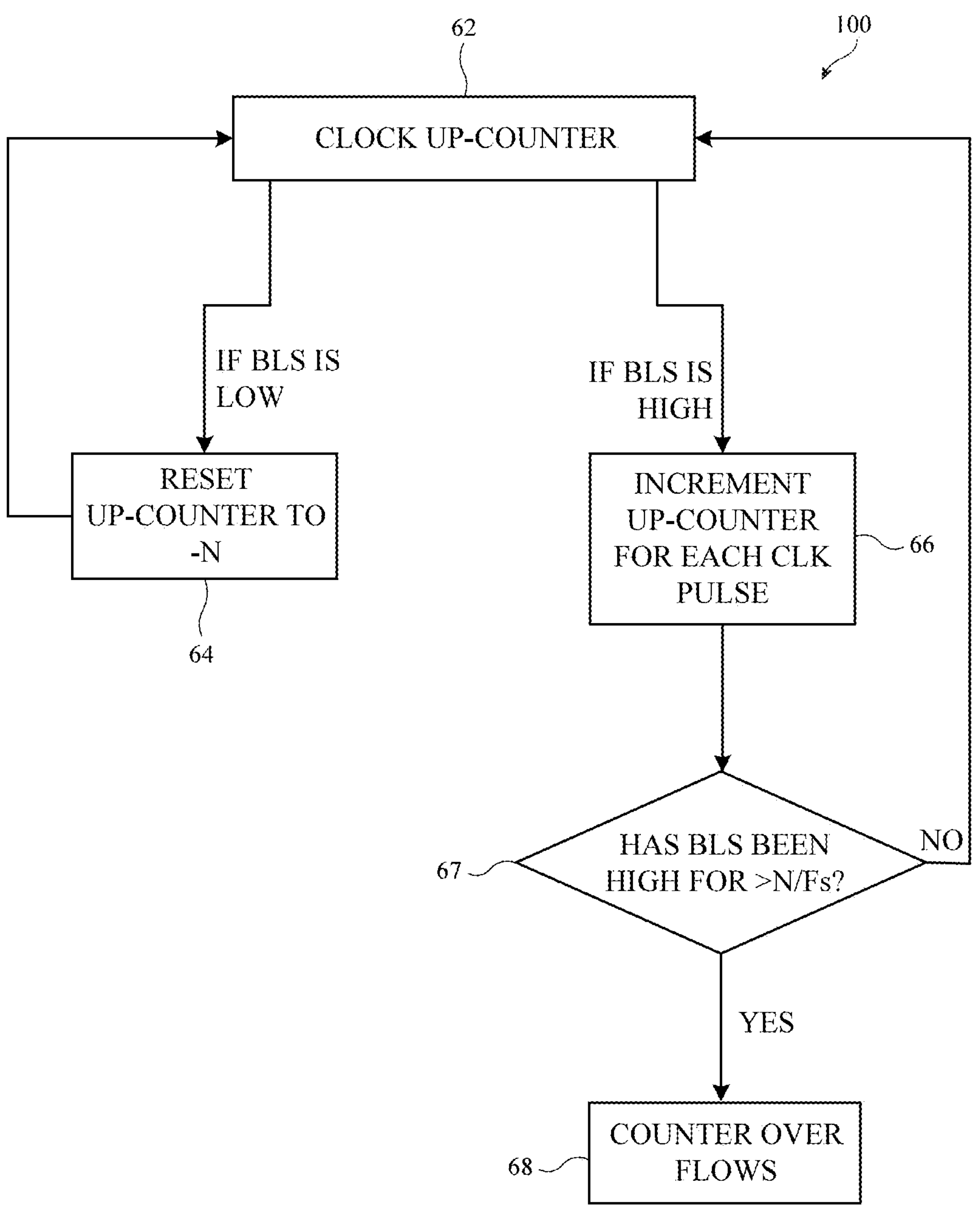
FIG. 6 is a flowchart of illustrative steps that may be used to determine whether measurements from a sensor with a long frame duration have been impacted by EMI in accordance with some embodiments.

As shown in flowchart 60 of FIG. 6, an up-counter may be clocked at step 62. In particular, the up-counter may be clocked at frame rate $F_S$, which may be greater than 10 kHz, at least 15 kHz, between 10 kHz and 20 kHz, or other suitable frame rate. In general, frame rate $F_S$ may be selected to detect both LTE® and Wi-Fi® EMI (e.g., the frame rate may be longer than the RF pulses of LTE® and Wi-Fi® communications circuitry), and/or any other EMI emitted by communications circuitry in the electronic device.

At step 64, if a binary logic signal (BLS 51 of FIGS. 4 and 5) is low, then the up-counter may be reset to −N. N may be any suitable value, such as at least 50, between 75 and 100, 80, or other value. In general, N may be selected based on the value of $F_S$ to ensure that the longest duration of an EMI pulse does not erroneously trigger the up-counter into detecting EMI.

In contrast, at step 66, if the binary logic signal is high, the up-counter may be incremented for each clock pulse. For example, after one high binary logic signal, the up-counter may be incremented to −N+1, and this process may be repeated for each consecutive clock pulse at which the binary logic signal remains high.

At step 67, if the binary logic signal has not been high for longer than $N/F_S$, then the process may return to step 62. If the binary logic signal has been high for longer than $N/F_S$, then the up-counter may overflow at step 68. Because the up-counter has been clocked at frame rate $F_S$ and reset to −N at low binary logic signals, the counter overflowing when the binary logic signal has been high for longer than $N/F_S$ indicates that the sensor measurement has been taken in the presence of EMI. Therefore, the up-counter overflowing may signal to circuitry in the electronic device, such as control circuitry 16 of device 10, that EMI was present for a sensor measurement, and that sensor measurement may be discarded. In contrast, in the absence of the up-counter overflowing, the sensor measurements during that time may be kept and used by circuitry in the electronic device to make one or more adjustment(s) to the device.

Figure 7:
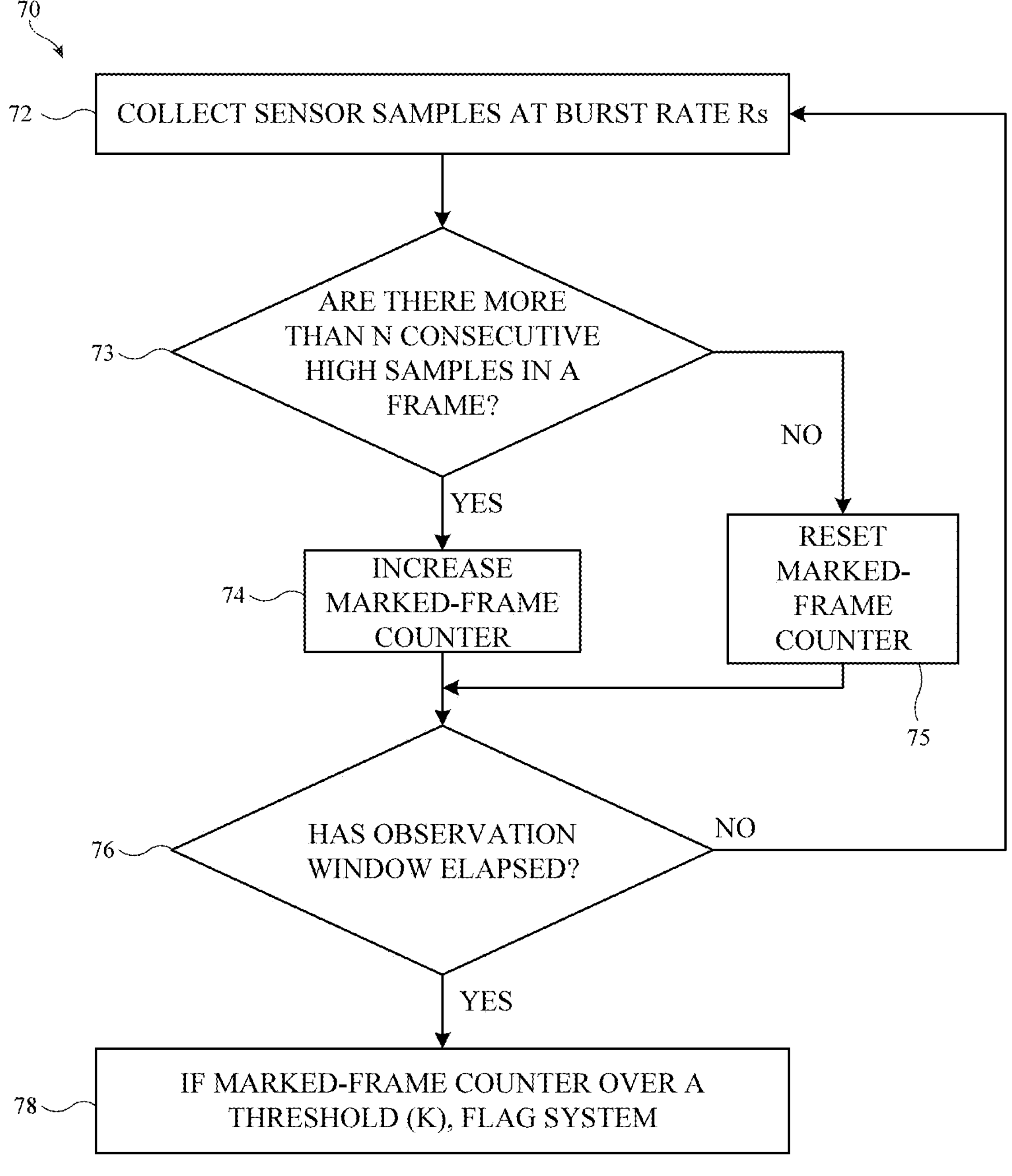
FIG. 7 is a flowchart of illustrative steps that may be used to determine whether measurements from a sensor with a short frame duration have been impacted by EMI in accordance with some embodiments.

In the described examples of FIGS. 6 and 7, EMI may be detected in sensor measurements from a sensor that operates continuously or from a sensor that operates periodically with frame rates that are longer than maximum EMI pulses (e.g., because the EMI pulses can fall mostly or entirely within the frame rates of the sensor). However, for sensors that operate periodically with frame rates that are shorter than the maximum EMI pulses, multiple frames of sensor measurements may be analyzed to determine whether EMI has interfered with the sensor measurements. A flowchart of illustrative steps with which a digital filter may determine whether EMI has impacted sensor measurements from a sensor with a short frame rate is shown in FIG. 7.

As shown in FIG. 7, flowchart 70 may begin at step 72. At step 72, sensor samples may be collected at burst rate $R_S$ using a sensor, such as a temperature sensor, ambient light sensor, pressure sensor, accelerometer, gyroscope, humidity sensor, heart rate sensor, blood oxygen sensor, or other sensor. The frames of data generated by the sensor may be less than the frames of RF pulses emitted by circuitry in the electronic device. The sensor may collect 91 kilosamples/second, at least 60 kilosamples/s, between 50 and 100 kilosamples/s, or other suitable samples per second.

At step 73, it may be determined whether there are more than N consecutive high samples (e.g., high BLS samples from FIGS. 4 and 5) in a given frame of EMI observation (also referred to as an EMI observation window herein). N may be any suitable number, such as 3, between 2 and 5, or other suitable number. In general, N may be selected based on the burst rate ($R_S$) of the sensor to ensure (or increase the probability) that EMI will be detected.

If there are more than N consecutive high samples within a given EMI observation window, then the process may proceed to step 74, in which a marked-frame counter may be increased (e.g., incrementally increased, such as by 1).

Alternatively, if there are not more than N consecutive high samples within a given EMI observation window, then the process may proceed to step 75, in which the marked-frame counter may be reset (e.g., to 0 or to another suitable number).

At step 76, it may be determined whether the observation window has elapsed. The EMI observation window may be set to collect a desired number of samples from the sensor to ensure (or increase the probability) that EMI will be detected. For example, the EMI observation window may be for 16 sensor samples, 8 sensor samples, 32 sensor samples, or other suitable number of sensor samples.

If the observation window has not elapsed, the process may continue with another frame of sensor data. In other words, the process may return to step 72, and the sensor may generate another sensor measurement.

Alternatively, if the observation window has elapsed (e.g., if the requisite number of sensor measurements have been taken and analyzed), the process may proceed to step 78. At step 78, if the marked-frame counter is over a threshold K, then the system may be flagged for EMI during the sensor measurements. K may be 3 or more, 5 or more, or other suitable value depending on the burst rate of the sensor, the observation window, and the value of N. The system may be flagged by sending a signal to circuitry in the device, such as control circuitry 16 of FIG. 1, that EMI is present in the observation window. The control circuitry may then take suitable action, such as discarding the sensor measurements during the observation window.

If the marked-frame counter is not over a threshold K, then the process of flowchart 70 may start over completely, and the sensor measurements may not be flagged for EMI. In other words, the marked-frame counter may be reset, and flowchart 70 may begin at step 72 with a new set of sensor measurements.

The process shown in flowchart 70 of FIG. 7 is an illustrative method of determining whether EMI is present in sensor measurements from a sensor with short frame duration.

FIGS. 5-7 show digital filter 54 as a discrete-time persistence filter (e.g., including an up-counter). However, this type of digital filter is merely illustrative. In general, any suitable digital filter may be used to determine whether sensor measurements have been subject to EMI.

Although the circuitry and associated processes of FIGS. 4-7 have described using a counter in a digital filter to determine whether a sensor measurement has been impacted by EMI, this is merely illustrative. In some embodiments, sensor measurements may be converted into the digital domain directly, and digital logic may be used to determine whether a sensor measurement has been impacted by EMI. An illustrative example of a circuit that may be used for such a determination is shown in FIG. 8.

Figure 8:
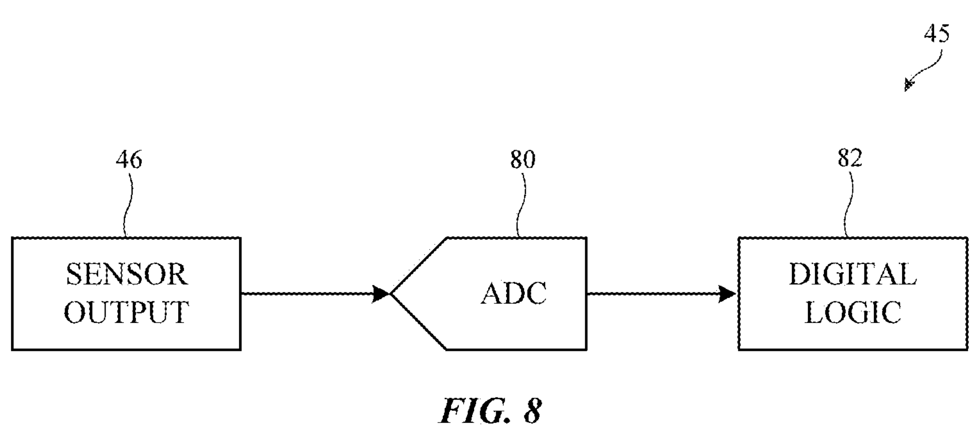
FIG. 8 is a diagram of an illustrative circuit that includes a sensor, an analog-to-digital converter, and a digital logic filter in accordance with some embodiments.

As shown in FIG. 8, circuit 45 may take sensor output 46 and convert it from an analog sensor measurement to the digital domain using analog-to-digital converter (ADC) 80. Sensor output 46 may be an output from a temperature sensor, ambient light sensor, pressure sensor, accelerometer, gyroscope, humidity sensor, heart rate sensor, or blood oxygen sensor, as examples.

After converting the sensor measurements into the digital domain, the digital signals may be passed to digital logic circuitry 82. Digital logic circuitry 82 may then process the digital signals to determine whether they have been impacted by EMI. An illustrative example of digital logic circuitry, such as digital logic circuitry 82, processing the digital signals is shown in FIG. 9.

Figure 9:
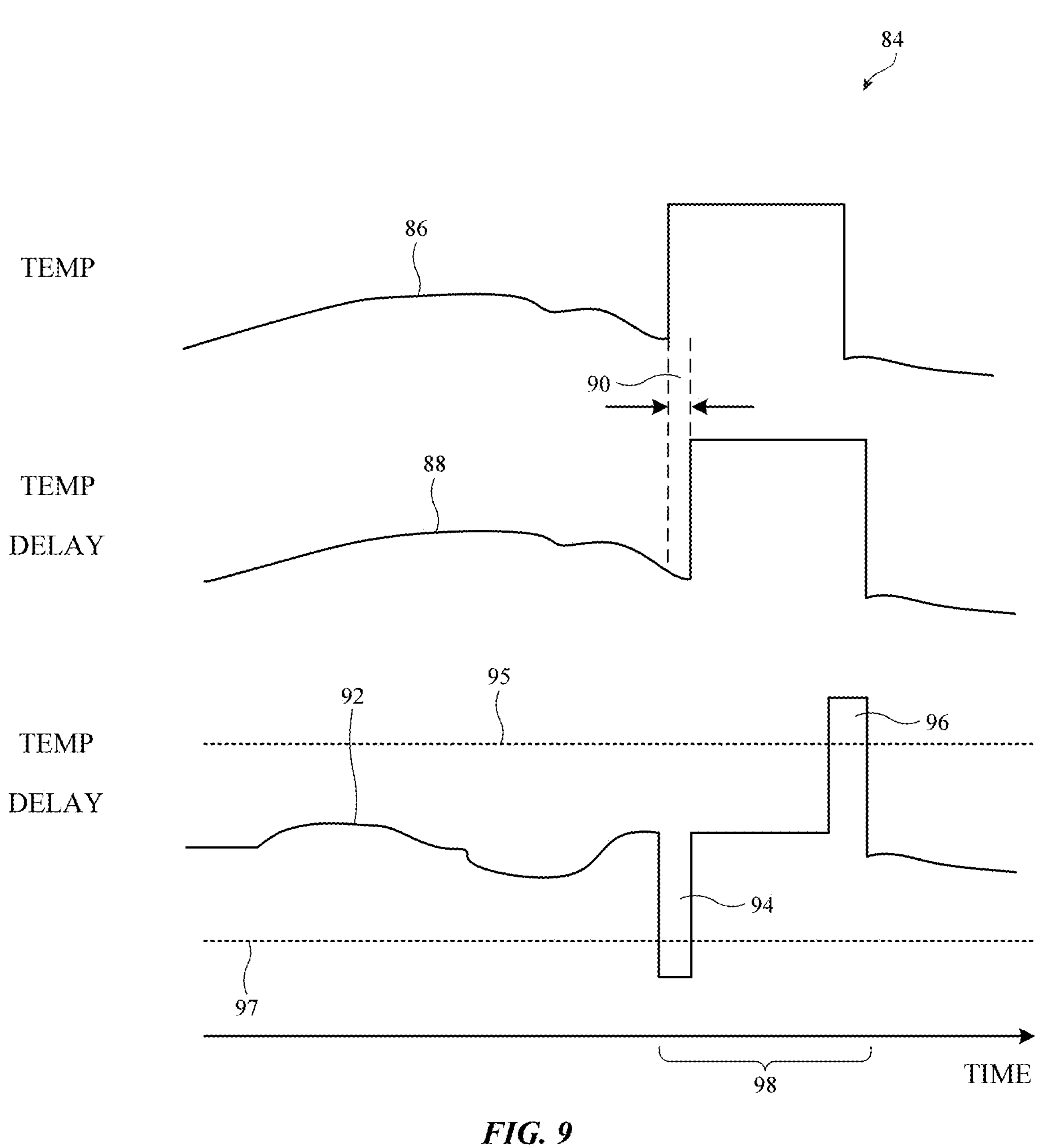
FIG. 9 is a diagram of an illustrative comparison between sensor measurements and time-delayed sensor measurements by a digital logic filter to determine whether the sensor measurements have been impacted by EMI in accordance with some embodiments.

As shown in FIG. 9, graph 84 may include an illustrative relationship 86 between temperature and time. The embodiment of FIG. 9 is based on the sensor producing sensor output 46 (FIG. 8) being a temperature sensor. Therefore, relationship 86 may be the readout of the temperature sensor in the digital domain over time. However, this is merely illustrative. In general, any suitable sensor may be used, and digital logic circuitry may consider the output of that sensor over time.

To determine whether the temperature sensor output has been affected by EMI, a second, delayed, relationship between temperature and time may be determined. In particular, relationship 88 may be the same as relationship 86 but delayed by time 90. Time 90 may be approximately 1 ms, may be equivalent to the length of time of one sensor measurement, or may be any other suitable delay.

Finally, a difference ("TEMP DELTA") between the temperature readout and the delayed temperature readout (relationships 86 and 88, respectively), may be taken. In the illustrative example of FIG. 9, the difference may be given by relationship 92. Sensor readings that are not subject to EMI may exhibit small changes in relationship 92. For example, changes that are less than thresholds 95 and 97 may be determined not to be impacted by EMI.

In contrast, sensor readings that have been affected by EMI may result in large positive and negative spiked pairs, shown as illustrative negative spike 94 and positive spike 96. Optionally, the digital logic circuitry may only consider spike pairs that are above/below a given threshold, such as the threshold shown by positive threshold 95 and negative threshold 97. In general, however, the digital logic circuitry may detect a positive and negative spike pair and may determine that the sensor measurements between the positive and negative spike pairs have been subject to EMI.

In particular, in the example of FIG. 9, the sensor measurements taken within time window 98 will be flagged by the digital logic circuitry as being subject to EMI. The digital logic circuitry and/or other circuitry in the electronic device (e.g., control circuitry 16 of FIG. 1) may then discard the sensor measurements during time window 98. In this way, digital logic circuitry may be used to determine whether EMI has occurred during a sensor measurement.

Although FIGS. 3-9 describe detecting EMI using a sensor measurement and discarding the same sensor measurement when EMI occurs, this is merely illustrative. In some embodiments, EMI may be detected using measurements from a first sensor, such as a temperature sensor, and measurements from a second sensor (e.g., another sensor on the same chip as the first sensor or otherwise subject to the same EMI as the first sensor), such as an ambient light sensor, may be discarded (along with the measurements from the first sensor, if desired). In general, any suitable sensor may be used for EMI detection and any desired sensor measurements may be discarded in response to determining that EMI has occurred.

As described above, one aspect of the present technology is the gathering and use of information such as sensor information. The present disclosure contemplates that in some instances, data may be gathered that includes personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, username, password, biometric information, or any other identifying or personal information.

The present disclosure recognizes that the use of such personal information, in the present technology, can be used to the benefit of users. For example, the personal information data can be used to deliver targeted content that is of greater interest to the user. Accordingly, use of such personal information data enables users to have control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the United States, collection of or access to certain health data may be governed by federal and/or state laws, such as the Health Insurance Portability and Accountability Act (HIPAA), whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, the present technology can be configured to allow users to select to "opt in" or "opt out" of participation in the collection of personal information data during registration for services or anytime thereafter. In another example, users can select not to provide certain types of user data. In yet another example, users can select to limit the length of time user-specific data is maintained. In addition to providing "opt in" and "opt out" options, the present disclosure contemplates providing notifications relating to the access or use of personal information. For instance, a user may be notified upon downloading an application ("app") that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data at a city level rather than at an address level), controlling how data is stored (e.g., aggregating data across users), and/or other methods.

Therefore, although the present disclosure broadly covers use of information that may include personal information data to implement one or more various disclosed embodiments, the present disclosure also contemplates that the various embodiments can also be implemented without the need for accessing personal information data. That is, the various embodiments of the present technology are not rendered inoperable due to the lack of all or a portion of such personal information data.

The foregoing is merely illustrative and various modifications can be made to the described embodiments. The foregoing embodiments may be implemented individually or in any combination.

What is claimed is:

1. An electronic device, comprising:

a sensor configured to generate sensor measurements;

a transmitter configured to transmit radio-frequency signals; and a digital filter configured to generate a signal in response to detecting electromagnetic interference in the sensor measurements, wherein the digital filter comprises an up-counter that is configured to be reset to a given value and to be clocked at a given frame rate, wherein the up-counter is configured to be reset to the given value when the sensor measurements are below a threshold, and wherein the up-counter is configured to overflow when the sensor measurements are above the threshold for a period of time longer than the given value divided by the given frame rate.

2. The electronic device of claim 1, further comprising:

control circuitry configured to discard the sensor measurements in response to the signal from the digital filter.

3. The electronic device of claim 1, wherein the digital filter comprises a digital persistence filter, the electronic device further comprising:

a comparator between the sensor and the digital filter.

4. The electronic device of claim 3, wherein the up-counter is configured to be incrementally increased at the given frame rate when the sensor measurements are above the threshold.

5. The electronic device of claim 4, wherein the overflow of the up-counter is configured to form the signal generated by the digital filter.

6. The electronic device of claim 3, wherein the sensor is configured to generate the sensor measurements at a given burst rate, and wherein the up-counter comprises a marked-frame counter.

7. The electronic device of claim 6, wherein the marked-frame counter is configured to be incrementally increased in response to a number of the sensor measurements being over a frame threshold.

8. The electronic device of claim 7, wherein the signal from the digital filter is configured to be output in response to the marked-frame counter being over a marked-frame threshold after an observation window has elapsed.

9. The electronic device of claim 3, further comprising:

a hysteresis circuit coupled between an output of the comparator and an input of the comparator.

10. The electronic device of claim 1, wherein the digital filter is configured to receive the sensor measurements directly.

11. The electronic device of claim 10, wherein the digital filter is configured to compare the sensor measurements to time-delayed sensor measurements to determine whether there is electromagnetic interference in the sensor measurements.

12. The electronic device of claim 11, wherein the digital filter is configured to generate the signal in response to a difference between the sensor measurements and the time-delayed sensor measurements being greater than a difference threshold.

13. An apparatus, comprising:

a sensor configured to generate sensor measurements at a given burst rate;

a comparator configured to output a respective indicator in response to each of the sensor measurements; and a digital persistence filter configured to determine, based on the respective indicator, whether there is electromagnetic interference in each of the sensor measurements, wherein the digital persistence filter comprises a marked-frame counter that is configured to be reset to a given value and to be clocked at a given frame rate.

14. The apparatus of claim 13, wherein the sensor is selected from the group consisting of: a temperature sensor, an accelerometer, a gyroscope, an ambient light sensor, a humidity sensor, a heart rate sensor, and a blood oxygen sensor.

15. The apparatus of claim 13, further comprising:

control circuitry that is configured to discard given sensor measurements in response to the digital persistence filter determining that the given sensor measurements have been subject to electromagnetic interference.

16. The apparatus of claim 13, wherein the marked-frame counter is configured to be incrementally increased in response to a number of the sensor measurements being over a frame threshold.

17. The apparatus of claim 16, wherein the digital persistence filter is configured to output a signal in response to the marked-frame counter being over a marked-frame threshold after an observation window has elapsed.

18. An electronic device, comprising:

a transmitter configured to transmit radio-frequency signals;

a circuit, comprising:

a sensor configured to generate sensor measurements; and a digital persistence filter configured to generate a signal in response to detecting electromagnetic interference in the sensor measurements, wherein the digital persistence filter comprises an up-counter that is configured to be reset to a given value and to be clocked at a given frame rate, wherein the up-counter is configured to be reset to the given value when the sensor measurements are below a threshold, and wherein the up-counter is configured to overflow when the sensor measurements are above the threshold for a period of time longer than the given value divided by the given frame rate; and control circuitry configured to disregard given sensor measurements in response to the signal.

* * * * *